United States Patent
Erhart et al.

(10) Patent No.: US 6,529,049 B2
(45) Date of Patent: Mar. 4, 2003

(54) PRE-CHARGED SAMPLE AND HOLD

(75) Inventors: Richard Alexander Erhart, Chandler, AZ (US); Thomas W. Ciccone, Tempe, AZ (US)

(73) Assignee: National Semiconductor Corporation, Santa Clara, CA (US)

( * ) Notice: Subject to any disclaimer, the term of this patent is extended or adjusted under 35 U.S.C. 154(b) by 0 days.

(21) Appl. No.: 09/852,486

(22) Filed: May 10, 2001

(65) Prior Publication Data

US 2002/0167343 A1 Nov. 14, 2002

(51) Int. Cl.$^7$ .................................................. H03K 5/00
(52) U.S. Cl. .......................................... 327/94; 327/337
(58) Field of Search ............................... 327/91–95, 337

(56) References Cited

U.S. PATENT DOCUMENTS 5,391,936 A * 2/1995 Soh ............................. 327/94
5,623,279 A * 4/1997 Itakura et al. ................. 327/94
5,872,470 A * 2/1999 Mallinson et al. ............ 327/94

* cited by examiner

Primary Examiner—Kenneth B. Wells
(74) Attorney, Agent, or Firm—Cahill, Sutton & Thomas P.L.C.

(57) ABSTRACT

A buffered sample-and-hold circuit includes two sampling capacitors for each analog voltage to be sampled. The two sampling capacitors are initially charged simultaneously to the analog voltage to be sampled. One of such sampling capacitors is thereafter temporarily coupled to the input terminal of a unity gain amplifier to pre-charge such input terminal, and any associated parasitic capacitance, to a voltage very near the actual sampled analog voltage. Following such pre-charge operation, that sampling capacitor is de-coupled from the input terminal of the amplifier; the other sampling capacitor is then coupled to the input terminal of the amplifier for establishing the actual sampled voltage at the input terminal of the amplifier.

9 Claims, 1 Drawing Sheet

PRE-CHARGED SAMPLE AND HOLD

BACKGROUND OF THE INVENTION

1. Field of the Invention

The present invention relates generally to sample-and-hold circuits used to temporarily store analog voltages, and more particularly, to a sample-and-hold circuit that is less susceptible to voltage errors caused by parasitic capacitance.

2. Description of the Related Art

Sample-and-hold circuits have been used for many years to capture and store an analog voltage sampled at a predetermined point in time. For example, a basic sample-and-hold circuit is described in *Integrated Electronics: Analog And Digital Circuits And Systems*, by Millman and Halkias, McGraw-Hill Book Company, 1972, pp. 570–571. A basic sample-and-hold circuit includes a mechanical or electronic switch or gate for selectively passing an analog voltage signal, and a storage capacitor in series with the switch for storing the analog voltage that was coupled by the switch to the storage capacitor just before the switch is opened. A practical sample-and-hold circuit also includes an operational amplifier configured in unity-gain feedback mode; the positive high-impedance input terminal of the op amp is coupled to the storage capacitor for receiving the sample voltage, while the negative input terminal of the op amp is connected to the low-impedance output terminal of the op amp. The output terminal of the op amp thereby tracks the sampled voltage, but the storage capacitor is isolated from any load being driven by the output terminal of the op amp.

Such sample-and-hold circuits are often used in integrated circuits used to drive analog voltages onto the columns of a liquid crystal display (LCD). Analog voltages are driven onto the columns of an LCD display in order to apply desired analog voltages to the various pixels of the display to create a desired image. The LCD display pixels are divided into rows and columns to form an array. A first row is selected, and the analog voltages to be applied to the pixels in the first row are driven onto the columns of the display; a second row is then selected, and new analog voltages are driven onto the columns of the display corresponding to the voltages to be applied to the pixels in the second row. This process is repeated for each row of the display. A sample-and-hold circuit is useful in such applications to temporarily store the analog voltage that is to be driven onto a column of the display during a particular row drive cycle.

To increase the speed of such LCD column driving circuitry, it may be desired to look ahead at the next analog voltage that will be applied to a particular column. In other words, the column driver circuit can be provided with a second analog voltage to be displayed on the second row drive cycle even before the column driver circuit has finished driving the first analog voltage onto the LCD display column during the first row drive cycle. In this mode of operation, the sample-and-hold circuitry is essentially buffering incoming analog values one cycle ahead of the cycle during which they are driven onto the columns of the LCD display. Such a circuit is shown in Prior Art FIG. 1, wherein an analog bus 10 is driven by an analog bus driver 12, and wherein a first analog switch 14 selectively couples the analog voltage on the bus to node 15 and to storage capacitor 16 (Cs) when control signal S1 is active; this might represent the analog voltage to be driven onto the LCD column during a second row drive cycle. A second analog switch 18 selectively couples the analog voltage on node 15 and storage capacitor 16 to node 19 and to the positive input terminal 20 of op amp 22 when control signal S2 is active. Note that a second capacitor 24 (Cp) is shown in FIG. 1 between node 19 and ground; this second capacitor 24 represents parasitic capacitance associated with node 19. Assuming switch 18 is open, then node 19 can represent the analog voltage to be driven onto the LCD column during the first row drive cycle, while node 15 is sampling the analog voltage to be driven onto the column during the second row drive cycle.

A problem that arises with the circuitry shown in FIG. 1 is that parasitic capacitance 24, associated with node 19 and the input terminal 20 of op amp 22, steals some of the charge stored on storage capacitor 16. Due to charge conservation, some of the charge that was originally stored on storage capacitor 16 will leak onto parasitic capacitance 24, which will create an error in the analog voltage that is amplified by amplifier 22 and being driven out onto the column of the LCD display. If the magnitude of the parasitic capacitance 24 is Cp, and the magnitude of the storage capacitance of storage capacitor 16 is Cs, then the error voltage is simply the magnitude of the parasitic capacitance Cp divided by the sum of Cp plus Cs, all multiplied by Vdiff, where Vdiff is the voltage difference between the voltage originally saved on storage capacitor 16 and the voltage that was previously charged across the parasitic capacitance 24. The worst case Vdiff (or Vmax) is the full-scale voltage swing of the minimum and maximum analog voltages to be driven onto the LCD column.

Accordingly, it is an object of the present invention to provide a sample-and-hold circuit to temporarily store analog voltages before coupling such analog voltages to an amplifier wherein errors in the sampled analog voltage due to parasitic capacitances are minimized when such voltage is passed to an amplifier for being driven onto the output of the amplifier.

It is a further object of the present invention to provide such a sample-and-hold circuit in a form suitable for use in electronic circuitry used to drive analog voltages onto the columns of an LCD display.

Still another object of the present invention is to provide such a sample-and-hold circuit which minimizes such errors without significantly complicating known sample-and-hold circuit techniques, and without significantly increasing the size of integrated circuits using such improved sample-and-hold circuit.

Yet another object of the present invention is to provide such a sample-and-hold circuit which may be used to reduce the size of integrated circuits that must sample and hold analog voltages while reducing analog voltage offset errors.

These and other objects of the present invention will become more apparent to those of skill in the art as the description of the present invention proceeds.

SUMMARY OF THE INVENTION

Briefly described, and in accordance with a preferred embodiment thereof, the present invention relates to a buffered sample-and-hold circuit for sampling an analog voltage and including a first sampling capacitor and a first switch coupled between a source of an analog voltage and the first sampling capacitor. The first switch selectively couples the analog voltage source to the first sampling capacitor. A second switch is interposed between the first sampling capacitor and the input terminal of a unity gain amplifier; this second switch selectively couples the voltage stored on the first sampling capacitor to the input terminal of the unity gain amplifier.

The components described thus far are present in known buffered sample-and-hold circuits. However, the present circuit further includes a second sampling capacitor; in the preferred embodiment of the present invention, this second sampling capacitor has a capacitance that is substantially equal to that of the first sampling capacitor; this second sampling capacitor is selectively coupled to the analog voltage source by a third switch. In addition, a fourth switch is interposed between the second sampling capacitor and the input terminal of the unity gain amplifier for selectively coupling the voltage stored on the second sampling capacitor to the input terminal of the unity gain amplifier.

In operating the circuitry of the present invention, control signals temporarily open the second and fourth switches so that a former analog voltage previously applied to the input terminal of the amplifier is not disturbed by any changes in the analog voltage source. This effectively disconnects the amplifier input from the analog voltage source, and allows the amplifier to continue supplying the former analog voltage. The control signals then allow the first and third switches to close for applying a new analog voltage source across the first and second sampling capacitors, thereby charging the first and second sampling capacitors to the new analog voltage. Preferably, the control signals then cause the first and third switches to open again in order to disconnect the first and second sampling capacitors from the analog voltage source; the analog voltage source can then be updated in preparation for providing the next analog voltage without disturbing the analog voltage stored on the first and second sampling capacitors.

When it is time to transfer the analog voltage stored on the first and second sampling capacitors to the input of the amplifier, the control signals first close the fourth switch, but leave the second switch open, for allowing the second sampling capacitor to pre-charge the input of the amplifier to the sampled analog voltage. For the reasons explained above, there will be some error due to charge sharing between the second sampling capacitor and the parasitic capacitance associated with the input of the amplifier. However, the input of the amplifier, and any parasitic capacitances associated therewith, will charge to very near the desired sampled voltage; in other words, the pre-charged voltage on the input of the amplifier will not differ greatly from the analog voltage that was sampled by the first sampling capacitor.

The fourth switch is then turned off (i.e., opened) by the control signals, and now the third switch is turned on (i.e., closed) to connect the first sampling capacitor to the input of the amplifier. This time, there is very little error on the voltage established at the input of the amplifier because the sampled analog voltage stored on the first sampling capacitor is not very far apart from the pre-charged voltage already applied to the amplifier input by the second sampling capacitor. Accordingly, the error in the analog voltage provided at the output of the amplifier is significantly reduced.

The present invention also relates to the above-described method of operating a buffered sample-and-hold circuit, including the steps of coupling the analog voltage source to be sampled onto the first and second sampling capacitors for storage thereby, temporarily coupling the second sampling capacitor to the input terminal of the amplifier to apply the pre-charged voltage thereto, and thereafter de-coupling the second sampling capacitor from the input terminal of the amplifier, and coupling the first sampling capacitor to the input terminal of the amplifier for establishing the sampled analog voltage at the input terminal of the amplifier. In practicing such method, it is preferred that the second sampling capacitor be selected to have a capacitance substantially equal to that of the first sampling capacitor. Ideally, the first and second sampling capacitors are de-coupled from the analog voltage source before coupling the second sampling capacitor to the input terminal of an amplifier to perform the pre-charge function.

DETAILED DESCRIPTION OF THE PREFERRED EMBODIMENTS

Figure 2:
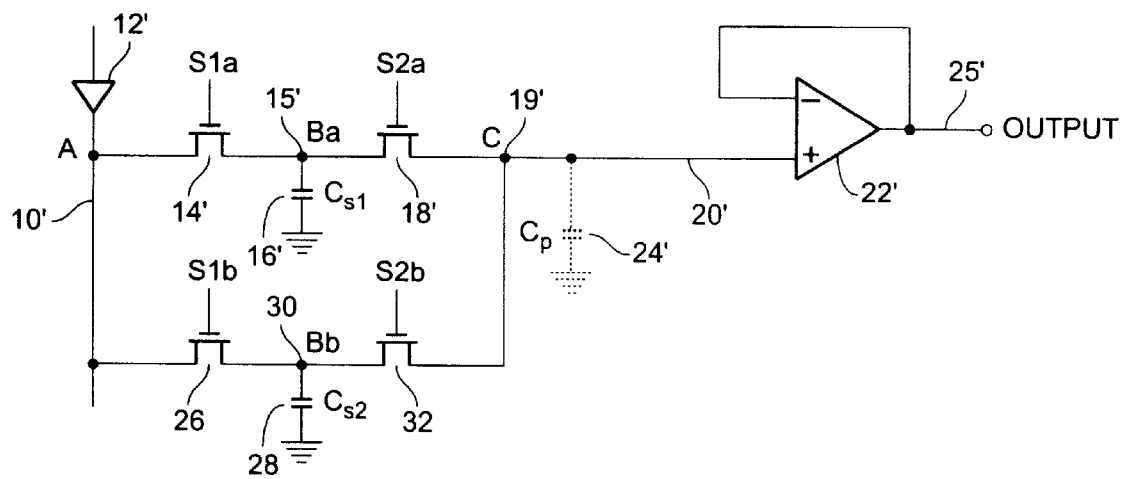
FIG. 2 is a schematic drawing of an improved buffered sample-and-hold circuit constructed in accordance with the present invention.

A buffered sample-and-hold circuit that makes use of the present invention is shown in the circuit schematic of FIG. 2. As mentioned above, such buffered sample-and-hold circuits are useful when one needs to perform back-to-back sequential sample-and-hold operations. By way of example, suppose that, in driving a liquid crystal display (LCD), a series of analog voltages are driven onto an analog bus, and a corresponding series of switches are used to selectively sample the appropriate analog value along a corresponding number of column driver output paths. Then, while the sampled analog values are being driven onto the various LCD columns, the next set of analog voltages are driven onto the analog bus in preparation for the next row drive cycle. In this manner, incoming analog values are buffered one cycle ahead of the row drive cycle during which they are actually driven onto the columns of the LCD display.

Figure 1:
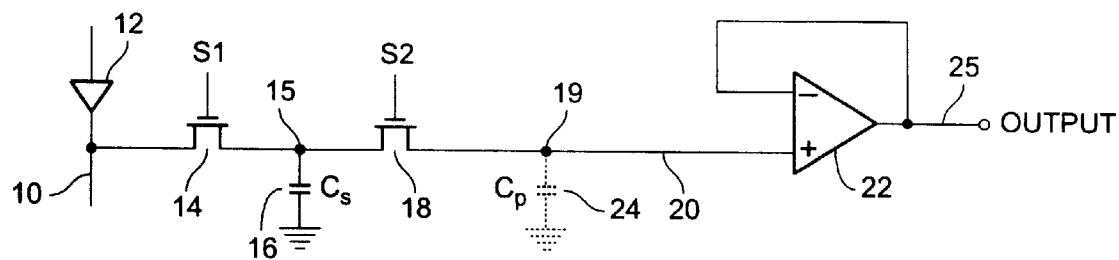
FIG. 1 is a schematic drawing of a prior art buffered sample-and-hold circuit.

Those circuit components within FIG. 2 which correspond to circuit components already described above in regard to FIG. 1 are identified by like primed reference numerals. Thus, analog bus 10' is driven by analog bus driver 12', which represents a source of an analog voltage to be sampled; again, this analog voltage might be an analog voltage to be driven onto a column of an LCD display during a next succeeding row drive cycle. First analog switch 14' is interposed between analog bus 10' and a first storage capacitor 16', and selectively couples the analog voltage on analog bus 10' (node A) to node 15' (node Ba) and to first storage capacitor 16' (Cs1) when control signal S1a is active. Storage capacitor 16' corresponds to a first sampling capacitor. Second analog switch 18' selectively couples the analog voltage stored on node 15' (Ba) and storage capacitor 16' to node 19' (node C) and to the positive input terminal 20' of op amp 22' when control signal 22' is active. Operational amplifier 22' has high input impedance input terminals. The negative input terminal of operational amplifier 22' is coupled by a feedback connection to the output terminal 25' for unity gain operation. Again, parasitic capacitance (Cp) is represented in FIG. 2 by capacitor 24' between node 19' and ground. The first and second switches 14' and 18' are again represented as simple MOS transistors, but any switching circuit capable of selectively coupling an analog voltage is suitable.

Still referring to FIG. 2, a third switch 26 is interposed between the analog bus 10' (node A) and a second sampling capacitor 28 (Cs2). Third switch 26 selectively couples the analog voltage on analog bus 10' (node A) to node 30 (node Bb) and to second storage capacitor 28 (Cs2) when control signal S1b is active. Storage capacitor 28 corresponds to a second sampling capacitor. A fourth analog switch 32 is interposed between node 30 (Bb) (and hence, second sampling capacitor 28) and non-inverting input terminal 20' of amplifier 22' for selectively coupling the voltage stored on second sampling capacitor 28 to input terminal 20'.

Figure 3:
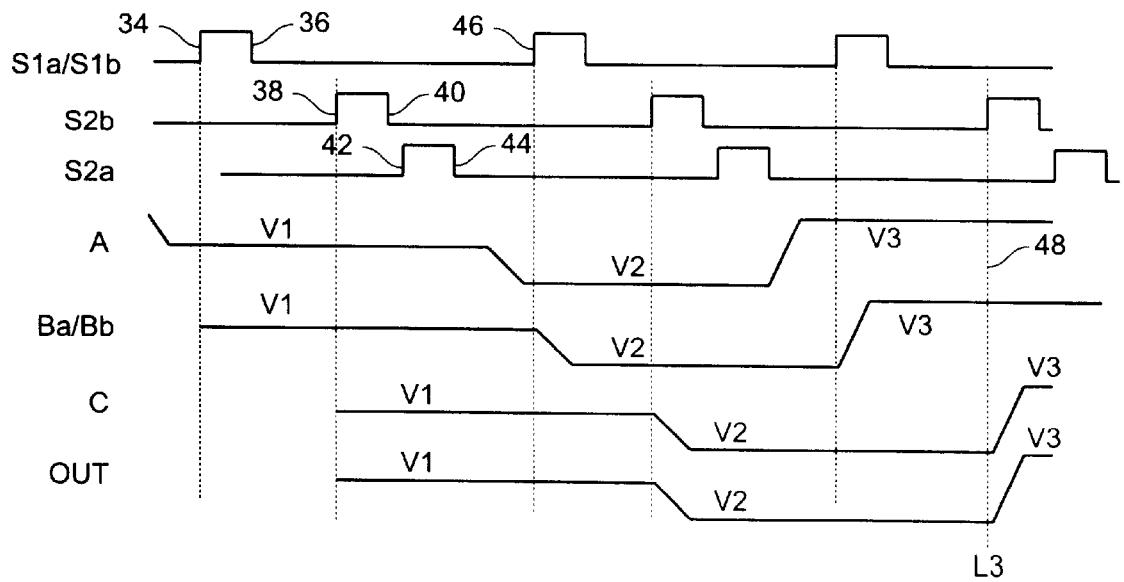
FIG. 3 is a timing diagram illustrating the timing of input signals, control signals, and output signals in conjunction with the circuit shown in FIG. 2.

The operation of the circuitry shown in FIG. 2 will now be described with the aid of the timing diagram shown in FIG. 3. As indicated in FIG. 3, the timing cycle begins when control signals S1a and S1b switch "high", or active" at the point designated by reference numeral 34. This action turns on (i.e., closes) switches 14' and 26 for allowing the voltage V1 on the analog bus to be transferred to nodes Ba and Bb (15' and 30, respectively), thereby charging the first and second storage capacitors 16' and 28 (Cs1 and Cs2) to incoming analog voltage V1. Control signals S1a and S2a then switch back low, or inactive, at the point designated by reference numeral 36, thereby turning off first switch 14' and third switch 26. It will be noted that during this entire time, control signals S2a and S2b are low, or inactive, and hence, second and fourth switches 18' and 32 are off (i.e., open). Thus, even though the first and second sampling capacitors 16' and 28 have sampled new analog voltage V1, such analog voltage does not yet appear at the output of amplifier 22'.

Next, during the "pre-charge" phase, which begins at the point designated by reference numeral 38, control signal S2b goes high, or active, while control signal S2a remains low. This action turns on (i.e., closes) analog switch 32, thereby coupling second sampling capacitor 28 (and node Bb) to node C, and hence, to the input terminal of the amplifier. This action pre-charges node C with analog voltage V1, except that there is an error (not visible in the voltage levels illustrated in FIG. 3) for the reason explained above. The error is the parasitic capacitance Cp divided by the sum of Cs2+Cp, all multiplied by the <u>initial</u> difference in voltage between nodes Bb and C before fourth switch 32 was enabled. It will be noted, however, that after the pre-charge phase, node C is <u>almost</u> at the sampled analog voltage V1. In other words, the difference between the actual desired analog voltage saved on node Ba by first sampling capacitor 16' and the pre-charged voltage on node C is relatively small, even if the initial voltage difference between node Bb and the voltage previously stored on node C was large.

Reference numeral 40 designates the end of the pre-charge phase, when control signal S2b goes low, and fourth switch 32 is turned off. Reference numeral 42 indicates the beginning of the final charge phase when control signal S2a goes high, or active, thereby turning on second switch 18', and coupling first sampling capacitor 16' to node C.

Since node C was already pre-charged close to analog voltage V1, the difference between the sampled analog voltage stored on node Ba and node C is very small. The parasitic capacitance Cp will still steal some small amount of charge off of first sampling capacitor Cs1, but the error in the analog voltage established at node C is very small. This error can be expressed as follows:

$$V_{error} = V_{max} * [(Cp)/((Cs1+Cp)*(Cs2+Cp))],$$

where Vmax is the maximum voltage difference between successive analog voltages, and wherein Cp, Cs1 and Cs2 are defined as above. Assuming that Cs1 and Cs2 are comparable to each other, then the voltage error is reduced according to the square of the ratio of the parasitic capacitance Cp relative to the sum of Cs1 plus Cp. To minimize such error as best as possible, the capacitance of second sampling capacitor 28 (Cs2) is selected to be substantially equal to the capacitance of first sampling capacitor 16' (Cs1).

Still referring to FIG. 3, control signal S2a returns low, or inactive, at the point designated by reference numeral 44, representing the end of the final charging phase. As indicated in FIG. 3, the analog voltage on the analog bus 10' (node A) can then be changed to a new analog voltage V2 without adversely effecting the voltages at nodes Ba, Bb or C. The next row drive cycle begins at the point designated by reference numeral 46, when control signals S1a and S1b return high, for allowing the new analog voltage V2 to be sampled upon nodes Ba and Bb by the first and second sampling capacitors 16' and 28, and the cycle is repeated. Assuming that analog voltage V3 shown in FIG. 3 is the most positive analog voltage, and that analog voltage V2 is the most negative analog voltage, then the worst case situation for analog voltage error takes place at the point designated by reference numeral 48, when node C attempts to change from voltage V2 to voltage V3.

Those skilled in the art will appreciate that the circuitry shown in FIG. 2 implements a method of operating a buffered sample-and-hold circuit which includes the steps of coupling the analog voltage to be sampled (i.e., the voltage on node A) onto first and second sampling capacitors Cs1 and Cs2 for storage of such analog voltage, and temporarily coupling second sampling capacitor Cs2 to input terminal 20' of amplifier 22' to apply a pre-charged voltage thereto, wherein the pre-charged voltage approximates the analog voltage stored on first sampling capacitor Cs1. In practicing such method, second sampling capacitor Cs2 is thereafter de-coupled from input terminal 20', and first sampling capacitor Cs1 is coupled to input terminal 20' of amplifier 22' for establishing the sampled analog voltage at input terminal 20'.

The benefits of the present invention can be realized in many different ways. It is true that the present invention requires twice as many sampling capacitors because of the secondary pre-charge paths, but one need not make the secondary path sampling capacitor Cs2 quite as large as the primary sampling capacitor Cs1. Moreover, one could decide to reduce the size of primary sampling capacitor Cs1 to half its original size, such that the total capacitance of sampling capacitors Cs1 and Cs2 is equal to the original capacitance of Cs1 before making use of the present invention; because of the squaring effect mentioned above, one can maintain the total chip area devoted to storage capacitors as a constant, and still significantly reduce the analog voltage error. Alternatively, one could elect to reduce the overall integrated circuit chip area devoted to storage capacitors (the sampling capacitors are the largest contributor to the circuit area required by such sample-and-hold circuits), and keep the same amount of analog voltage error that was previously experienced without the benefit of the present invention. For example, if the error must be less than 10 millivolts for Vmax equal to 1 volt, then the prior art method shown in FIG. 1 would require a storage capacitor that is 100 times as large as the parasitic capacitance Cp. However, by making use of the present invention, the same maximum 10 millivolts of error can be maintained using two sampling capacitors (Cs1 and Cs2) that are only one-tenth the size of parasitic capacitance Cp. Silicon area is linear with capacitor size, so the two sampling capacitors would require only 20% of the chip area formerly required by the single sampling capacitor of the prior art construction of FIG. 1.

Further component reductions can also be achieved by sharing a second sampling capacitor (Cs2) among two or more channels, assuming that one can afford the time. In other words, by providing non-overlapping timing control signals, and a sufficient number of analog switches, one may use the same pre-charge capacitor (Cs2) to serve the same function in two or more analog data paths; this would reduce the number of such secondary path pre-charge capacitors. Note that, while FIG. 3 shows control signals S1a and S1b switching at exactly the same time, this need not be the case, and such signals can be staggered to reduce charge injection errors.

While the present invention has been described with respect to a preferred embodiment thereof, such description is for illustrative purposes only, and is not to be construed as limiting the scope of the invention. Various modifications and changes may be made to the described embodiment by those skilled in the art without departing from the true spirit and scope of the invention as defined by the appended claims.

We claim:

1. A buffered sample-and-hold circuit for sampling an analog voltage, comprising in combination:
   a. a source of an analog voltage to be sampled;
   b. a first sampling capacitor;
   c. a first switch interposed between the analog voltage source and the first sampling capacitor for selectively coupling the analog voltage sourced by the analog voltage source to the first sampling capacitor;
   d. an amplifier having an input terminal and an output terminal;
   e. a second switch interposed between the first sampling capacitor and the input terminal of the amplifier for selectively coupling a voltage stored on the first sampling capacitor to the input terminal of the amplifier;
   f. a second sampling capacitor;
   g. a third switch interposed between the analog voltage source and the second sampling capacitor for selectively coupling the analog voltage sourced by the analog voltage source to the second sampling capacitor;
   h. a fourth switch interposed between the second sampling capacitor and the input terminal of the amplifier for selectively coupling a voltage stored on the second sampling capacitor to the input terminal of the amplifier; and
   i. control means for closing the first and third switches, and opening the second and fourth switches, to sample the sourced analog voltage across the first and second sampling capacitors, said control means thereafter temporarily closing the fourth switch to pre-charge the input terminal of the amplifier with the analog voltage sampled by the second sampling capacitor, said control means thereafter opening the fourth switch and closing the second switch to couple the analog voltage sampled by the first sampling capacitor to the input terminal of the amplifier.

2. The buffered sample-and-hold circuit recited by claim 1 wherein said amplifier is a high input impedance, unity gain amplifier.

3. The buffered sample-and-hold circuit recited by claim 1 wherein said second sampling capacitor has a capacitance substantially equal to that of said first sampling capacitor.

4. The buffered sample-and-hold circuit recited by claim 1 wherein said control means opens the first and third switches to de-couple the first and second sampling capacitors from the analog voltage source before closing the fourth switch to pre-charge the input terminal of the amplifier.

5. The buffered sample-and-hold circuit recited by claim 1 wherein said first, second, third and fourth switches are MOS transistors.

6. A method of operating a buffered sample-and-hold circuit comprising the steps of:
   a. coupling an analog voltage source to be sampled onto first and second sampling capacitors for storage by the first and second sampling capacitors;
   b. temporarily coupling the second sampling capacitor to an input terminal of an amplifier to apply a pre-charged voltage to the input terminal of the amplifier, the pre-charged voltage approximating the analog voltage stored on the first sampling capacitor;
   c. thereafter de-coupling the second sampling capacitor from the input terminal of the amplifier, and coupling the first sampling capacitor to the input terminal of the amplifier for establishing the sampled analog voltage at the input terminal of the amplifier.

7. The method recited by claim 6 including the step of operating the amplifier as a high input impedance, unity gain amplifier.

8. The method recited by claim 6 including the step of selecting the second sampling capacitor to have a capacitance substantially equal to that of the first sampling capacitor.

9. The method recited by claim 6 including the step of de-coupling the first and second sampling capacitors from the analog voltage source before coupling the second sampling capacitor to the input terminal of an amplifier.

* * * * *